US012787454B2

(12) United States Patent
Tarnas et al.

(10) Patent No.: US 12,787,454 B2
(45) Date of Patent: Nov. 3, 2026

(54) FABRICATING SOLAR CELL COVERGLASS FROM MOLTEN REGOLITH ELECTROLYSIS ELECTROLYTE

(71) Applicant: Blue Origin Manufacturing, LLC, Huntsville, AL (US)

(72) Inventors: Jesse Dylan Tarnas, Los Angeles, CA (US); Jeong Chul Lee, Monrovia, CA (US); Erica Mae Pitcavage, Altadena, CA (US); Alexander Imbault, Sierra Madre, CA (US)

(73) Assignee: Blue Origin Manufacturing, LLC, Huntsville, AL (US)

( * ) Notice: Subject to any disclaimer, the term of this patent is extended or adjusted under 35 U.S.C. 154(b) by 145 days.

(21) Appl. No.: 18/629,643

(22) Filed: Apr. 8, 2024

(65) Prior Publication Data

US 2025/0318281 A1 Oct. 9, 2025

(51) Int. Cl.
*H10F 19/80* (2025.01)
*H10F 71/00* (2025.01)

(52) U.S. Cl.
CPC ......... *H10F 19/804* (2025.01); *H10F 71/137* (2025.01)

(58) Field of Classification Search
None
See application file for complete search history.

(56) References Cited

U.S. PATENT DOCUMENTS 12,065,743 B1 * 8/2024 Agarwal ............... B05B 7/1404
2002/0145692 A1 * 10/2002 Ohkouchi ......... G02F 1/133734 349/124
2022/0195589 A1 6/2022 Ignatiev
2023/0250529 A1 8/2023 Ignatiev
2025/0084553 A1 * 3/2025 Carol ........................ C25B 9/30

OTHER PUBLICATIONS

Schleppi et al., J. Mater. Sci., (2021), 56:12132-12153 (Year: 2021).*
Shaw et al., Minerals, 2023, 13, 79. (Year: 2023).*
Madhuchhanda Bhattacharya, Tanmay Basak, "A review on the susceptor assisted microwave processing of materials," Energy, vol. 97, Feb. 15, 2016, pp. 306-338.
Solar Cell Cover Glass Development First Quarterly Report No. 1, Jun. 15, 1966-Sep. 1, 1966 Prepared by Ion Physics Corporation, 38 pages.

* cited by examiner

*Primary Examiner* — Eli S Mekhlin
(74) *Attorney, Agent, or Firm* — Summit Patents, PC

(57) ABSTRACT

A solar cell that incorporates a thin layer of transparent silicate, and a number of techniques for fabricating the thin layer of transparent silicate, are presented. The transparent silicate may be a protective coverglass on the solar cell or solar panel. Fabricating the coverglass may include vaporizing iron-depleted lunar regolith to produce vaporized transparent silicate and allowing the vaporized transparent silicate to condense onto a solar panel to form the coverglass. Vaporizing the iron-depleted lunar regolith to produce the vaporized transparent silicate may involve directing an electron beam onto the iron-depleted lunar regolith in a process of electron-beam physical vapor deposition (EBPVD). The iron-depleted lunar regolith may be electrolyte of a molten electrolysis process.

14 Claims, 2 Drawing Sheets

FABRICATING SOLAR CELL COVERGLASS FROM MOLTEN REGOLITH ELECTROLYSIS ELECTROLYTE

BACKGROUND

Fabrication of devices and processing of materials are generally energy-intensive operations. Most often, the form of energy is electricity. On Earth, there is an ever-increasing recognition that energy is a valuable resource to be conserved or used wisely. On the Moon, availability of energy, such as electricity for use in fabrication or material processing, is presently limited to Earth-derived resources (e.g., fuel cells, batteries, etc.). Thus, providing electricity for fabrication or material processing on the Moon may be challenging.

Solar panels have become relatively commonplace as a means for generating electricity via the sun. Solar panels may comprise photovoltaic solar modules that absorb sunlight as a source of energy to generate direct-current electricity. A photovoltaic module is a packaged, connected assembly of photovoltaic solar cells available in different voltages and wattages.

Solar cells have been, and continue to be, the main power source for most Earth orbiting satellites and various probes in the inner solar system since they provide a favorable power-to-weight ratio. Moreover, equipment and occupants in a space, lunar, or planetary environment have few other power options. Unfortunately, costs associated with bringing (e.g., launching) solar cells or panels into space from Earth are very high.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
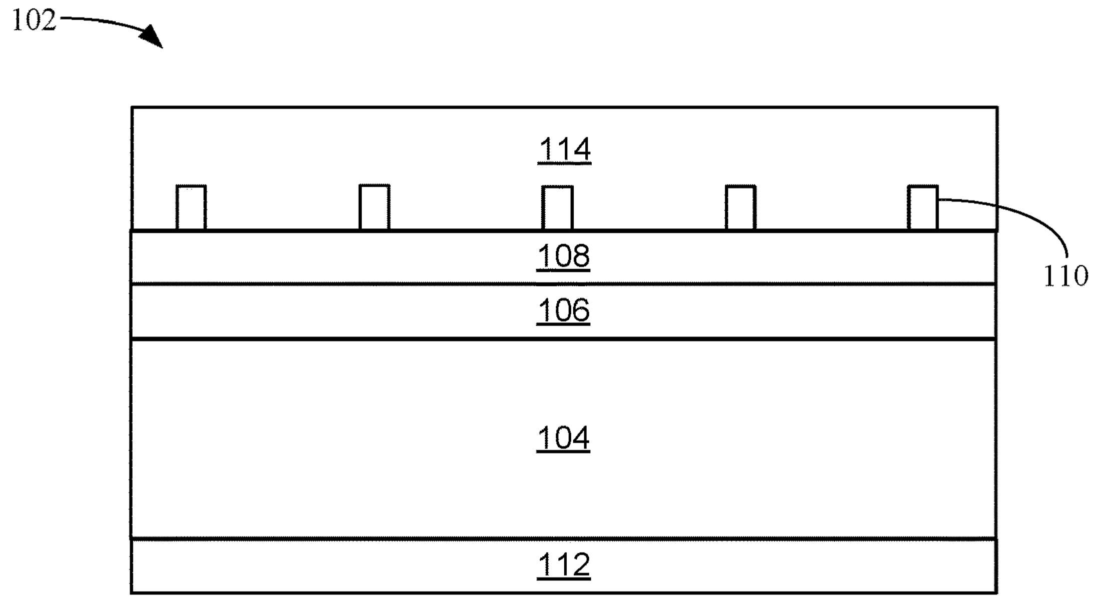
FIG. 1 is a schematic cross-section of a solar cell, according to some embodiments.

Lunar regolith, rocks, or other naturally derived feedstocks may generally lead to materials with impurities that are undesired in subsequent steps of production or fabrication. For example, lunar regolith contains many minerals; the bulk composition of regolith can be expressed as a mixture of different oxides, such as silica, titania, alumina, magnesia, iron oxide, and calcium oxide, just to name a few examples. For most applications it is beneficial to have some elements and less of others. Some elements may be detrimental if included in material to make clear glass, which may be used in the fabrication of solar cells for providing electricity on the Moon. For example, the presence of iron oxides in silicon for glass fabrication may result in relatively dark, low-transmittance glass. In addition to possible problems created by the presence of some oxides in a bulk oxide material, impurities in the bulk material not only can modify the development of grain structure formation but can also interact with structural defects to create regions of deleterious minority carrier lifetime recombination in solar cells, for example.

This disclosure describes a solar cell that incorporates a thin layer of silicate as a coverglass, which acts as a protective coating against radiation degradation and dust degradation, and a number of techniques for placing the coverglass on the solar cell. Whereas a coverglass may comprise pure silicon dioxide ($SiO_2$), a composition of coverglass may be a silicate containing significant amounts of Mg and Ca with some additional minor cations (e.g., Na, K, and Ti). For example, the silicate may comprise silicon dioxide and possibly more than 10% other metal oxides, though claimed subject matter is not limited to this example. Removing or reducing the concentration of some cations (e.g., Fe), as indicated above, may decrease opacity of a silicate glass. Herein, the term "transparent silicate" may be used to represent a silicate that has had such cation complete or partial removal that results in decreased opacity. Though the word "transparent" is used herein, claimed subject matter is not limited to a particular level of transmissivity of the silicate. Instead, "transparent silicate" indicates that the silicate has an increased transmissivity due to processes (e.g., cation removal) described herein. In some embodiments, the silicate may be derived from an electrolyte produced from regolith (e.g., lunar regolith) by a molten regolith electrolysis (MRE) process, as discussed below. In particular, the MRE process may include removing iron or iron oxide from the regolith during the MRE process. Herein, the terms "iron oxide" or "$FeO_x$" broadly refer to all stoichiometric combinations of iron and oxygen, unless otherwise specified. For example, iron oxide may be $Fe_xO_y$, where x and y are any integers. Removal of iron oxide from regolith, as described herein, may involve iron as a mixture of $Fe^{2+}$ and $Fe^{3+}$, both generically referred to herein as $FeO_x$.

A solar cell, or photovoltaic cell, is an electronic device that converts the energy of light directly into electricity by the photovoltaic effect. Electrical characteristics, such as current, voltage, and resistance, vary when exposed to light. Individual solar cell devices are often the electrical building blocks of photovoltaic modules, such as solar panels. The operation of a photovoltaic (solar) cell involves three basic attributes: 1) The absorption of light to generate excitons (bound electron-hole pairs), unbound electron-hole pairs (via excitons), or plasmons. 2) The separation of charge carriers of opposite types. 3) The extraction of those carriers to an external circuit.

Solar cells may be p-type or n-type. The term p-type refers to the solar cell being built on a positively charged (p-type) silicon base. For example, the silicon base may be doped with boron (trivalent), which has one valence electron less than silicon (quadrivalent). The top of the silicon base may be negatively doped (n-type) with phosphorous (pentavalent), which has one valence electron more than silicon. This arrangement forms a p-n junction that will enable the flow of electricity in a solar panel. Other elements may be used for doping in different embodiments.

In embodiments described below, coverglass comprising silicate may be placed on the surface of a solar cell. The coverglass may be placed on the solar cell using an electron beam to evaporatively deposit electrolyte formed by removing iron from regolith via a molten regolith electrolysis process. This process may provide a method for producing coverglass on the Moon using in-situ resources. This could also be applied for in-situ resource utilization on Earth and other planetary bodies, for example. Coverglass may generally increase the lifetime of a solar panel by protecting the underlying solar cells from high energy particles.

In particular embodiments, coverglass comprising transparent silicate may be formed from lunar in-situ resources. For example, transparent silicate can be formed from lunar regolith by separating out silicon and oxygen from the regolith, then recombining the silicon and oxygen to make silicon dioxide. This process generally requires silicon reduction via molten regolith electrolysis, which is more energy intensive than, for example, iron reduction via molten regolith electrolysis. This process also may require a way to store oxygen and subsequently recombine it with silicon. The combination of these process steps may be relatively energy intensive and complex compared to a process of removing iron from lunar regolith to produce iron-depleted electrolyte, as described herein.

$FeO_x$ is relatively abundant in lunar regolith. Thus, fabrication of silicate coverglass for solar cells on the Moon may necessarily involve a step of removing iron oxide from the lunar regolith before extracting the iron-depleted silicate electrolyte. $FeO_x$ is also relatively abundant on Earth, so there may be circumstances where Earth-bound solar cell fabrication would likewise involve removing iron oxide before extracting transparent silicate.

In some embodiments, a method for fabricating coverglass disposed on a solar cell (or panel) may include vaporizing iron-depleted lunar regolith to produce vaporized silicate and allowing the vaporized silicate to condense onto the solar cell to form the coverglass. The iron-depleted lunar regolith may be an electrolyte of a molten electrolysis process, for example. In some particular examples, the iron-free lunar regolith may comprise less than about 0.5% iron content by weight, though claimed subject matter is not so limited. In some implementations, vaporizing the iron-depleted lunar regolith to produce the vaporized silicate may involve directing an electron beam onto the iron-depleted lunar regolith. The vaporization and deposition may be performed in the natural vacuum that exists on the Moon. On Earth, however, an artificial vacuum may be provided to the vaporization and deposition processes.

As mentioned above, iron oxide may be in lunar regolith, or in minerals found on off-Earth locations and/or objects in the Solar System, such as asteroids, moons, minor-planets, and planets, among other objects. In such an example case, regolith may be harvested from the lunar surface and iron oxide minerals, or elemental iron, may be separated out by any of a number of techniques, such as molten oxide electrolysis (MOE), molten regolith electrolysis (MRE), high-gradient magnetic separation, or flotation processes, for example. In other embodiments, regolith harvested from the lunar surface may be processed mechanically to separate out at least a substantial portion of iron bearing minerals.

In addition to being used for solar panels as a protective coverglass, silicon dioxide may be grown on a variety of silicon semiconductor surfaces. For example, silicon dioxide layers may be used to protect silicon surfaces during diffusion processes and may be used for diffusion masking during fabrication of other parts of a solar panel. In another example, silicate deposition may be used for surface passivation to render a semiconductor surface inert so that semiconductor properties do not change as a result of interaction with air or other materials in contact with the surface. The process of silicon surface passivation by thermal oxidation (e.g., silicon dioxide) may be used to manufacture metal-oxide-semiconductor field-effect transistors (MOSFETs) and silicon integrated circuit chips.

The formation of a thermally deposited silicon dioxide or silicate layer may also reduce the concentration of electronic states at a silicon surface. Silicon dioxide or silicate films generally preserve the electrical characteristics of p-n junctions and prevent their electrical characteristics from deteriorating by the ambient environment. In this way, silicon dioxide or silicate layers may be used to electrically stabilize silicon surfaces. The surface passivation process may be used in semiconductor device fabrication that involves coating a silicon wafer with an insulating layer of silicon dioxide or silicate so that electricity could reliably penetrate to the conducting silicon below.

In some embodiments, the vaporization and deposition processes may be performed such that gases (e.g., boron, hydrogen, etc.) are not reacted with any portion of the silicon dioxide or silicate on the solar panel. Claimed subject matter is not limited to any particular material compositions, deposition methods, or post-treatment of silicon dioxide or silicate. For example, a process of fabricating a transparent silicate coverglass for a solar panel may involve e-beam evaporation, though sputtering may be an alternative process for transparent silicate deposition.

FIG. 1 is a schematic cross-section of a silicon heterojunction solar cell 102, according to some embodiments. Solar cell 102 includes a silicon substrate 104, which may be formed from a silicon wafer. An emitter 106 is deposited or formed (e.g., via doping) on the silicon substrate. An at least partially transparent conductive material, such as an indium tin oxide (ITO) layer 108 may overlay the emitter. Conductive contacts 110 may be electrically connected to ITO 108. In some implementations, a metallic layer 112, such as aluminum may be disposed on silicon substrate 104, on the side opposite to that of emitter 106, as a rear electrical contact. A protective coverglass 114, which may be transparent silicate, may be deposited onto solar cell 102 and may cover ITO layer 108 and at least partially cover contacts 110, for example.

In some implementations, silicon substrate 104 may be p-type and emitter 106 may be n-type. In other implementations, silicon substrate 104 may be n-type and emitter 106 may be p-type. In still other implementations, semiconductor materials other than silicon (e.g., germanium) may be used, and claimed subject matter is not limited to any particular substrate material. More particularly, claimed subject matter is not limited to any particular type or configuration of solar cell or solar panel.

Dimensions of the various parts of solar cell 102 are not illustrated to scale. For example, silicon substrate 104 may be about 180 microns thick and the thickness of emitter 106 may be in a range of about 3 to 20 nanometers (nm). ITO 108 may have a thickness of about 80 nm, and coverglass 114 (e.g., transparent silicate) may have a thickness of about 150 microns, though claimed subject matter is not limited to any of these example values. For example, the coverglass may have a thickness in a range from about 1 to about several hundreds of micrometers.

In some embodiments, impurities such as aluminum and titanium, which are generally present in lunar regolith, for example, may be present in coverglass 114. These impurities may beneficially reduce optical transmission of the coverglass at ultraviolet (UV) wavelengths, thereby providing protection of the underlying solar cell from UV radiation, which may damage or adversely affect operation of the solar cell.

Figure 2:
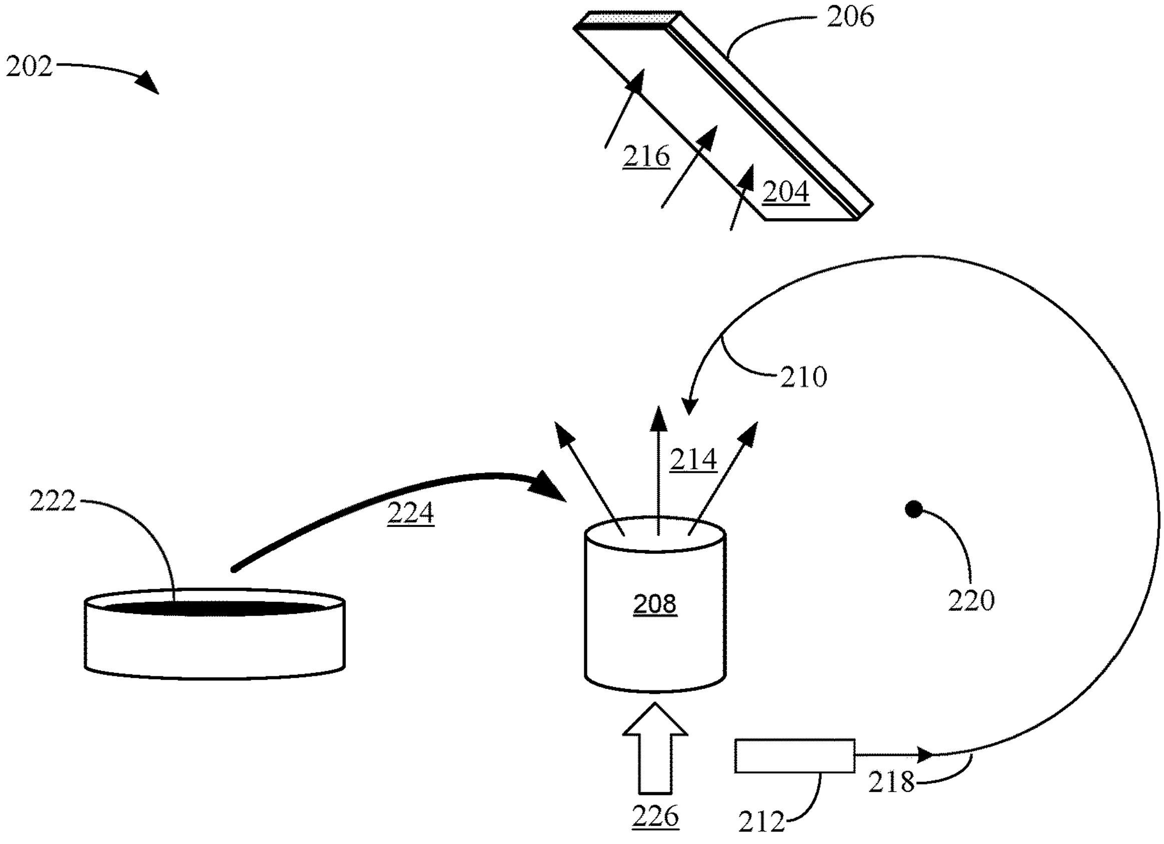
FIG. 2 is a schematic depiction of growing a thin film onto a substrate, according to some embodiments.

FIG. 2 is a schematic depiction of a process 202 of growing a transparent silicate thin film 204 onto a substrate, such as a solar cell 206, according to some embodiments, some of which involve electron-beam physical vapor deposition. Other embodiments may involve application of heat, as described below. Solar cell 206 may be the same as or similar to solar cell 102, for example.

Electron-beam physical vapor deposition (EBPVD) is a type of physical vapor deposition in which a target anode is bombarded with electrons emitted from an electron gun. The electrons may transform atoms or molecules of the target anode into a gaseous phase. For example, silicon atoms may be vaporized while oxygen may be mostly molecular (02) and not in atomic/plasma form. $SiO_2$ may be vaporized as a molecule. The atoms or molecules may then precipitate into a solid form, coating objects placed within lines of sight (e.g., within a solid angle of a hemispherical vapor emission distribution) from the target anode. For example, referring to FIG. 2, solar cell 206 may be placed in a line of sight of iron-depleted regolith 208, which acts as a target anode. As a result of iron-depleted regolith 208 being bombarded with electrons 210 emitted from an electron gun 212, transparent silicate in the iron-depleted regolith (e.g., the target anode) may be transformed into a gaseous phase 214 and liberated from the bulk iron-depleted regolith. The transparent silicate may then precipitate, indicated by 216, into a solid form, coating solar cell (or a solar panel) with thin film 204 of the transparent silicate that can act as a protective coverglass.

On the Moon, an EBPVD system need not be in an evacuated deposition chamber because the Moon provides a vacuum that is sufficient to allow passage of electrons from the electron gun to the evaporation material. The generated electron beam 218 may be accelerated to a relatively high kinetic energy and directed toward the evaporation material using a magnetic field 220. The evaporation material may be in the form of an ingot, rod, or molten bulk liquid (contained in a crucible, for example). Upon striking the evaporation material, the electrons will rapidly lose their energy. The kinetic energy of the electrons is converted into other forms of energy, such as thermal energy, through interactions with the evaporation material. The thermal energy that is produced heats up the evaporation material causing it to melt or sublimate. At a sufficiently high temperature, vapor will result from the melt or solid. The resulting vapor can then be used to coat surfaces, as described above. In contrast to the Moon, or other locations void of an atmosphere, on Earth an EBPVD system would have to be in an evacuated deposition chamber to allow uninterrupted passage of electrons from the electron gun to the evaporation material.

As mentioned above, transparent silicate thin film 204 may act as a coverglass to protect underlying solar cell 206. The transparent silicate may be derived from lunar regolith harvested from the Moon surface. After removing iron, such as iron oxide or iron oxide minerals, from the harvested regolith, iron-depleted regolith 222 may be transferred, indicated by arrow 224, to an EBPVD system, described above. In some implementations, the iron-depleted regolith need not be transferred to an EBPVD system. For example, an MRE process performed on the Moon to produce electrolyte from lunar regolith may already be in a vacuum (e.g., the natural vacuum of the Moon) that is sufficient for an EBPVD process.

In other implementations, instead of a process of electron beam vaporization, heat 226 may be supplied to the iron-depleted regolith to heat and vaporize transparent silicate. The vaporization process may involve altering conditions, such as the duration and temperature of applied heat 226 or, in the case of an EBPVD process, intensity of electron impingement, for vaporizing the transparent silicate.

The addition of trace elements or dopants may improve transparency, dust tolerance, and UV protection performance of the coverglass for some applications. In some implementations, phosphorus and/or boron may be added to the coverglass composition.

Figure 3:
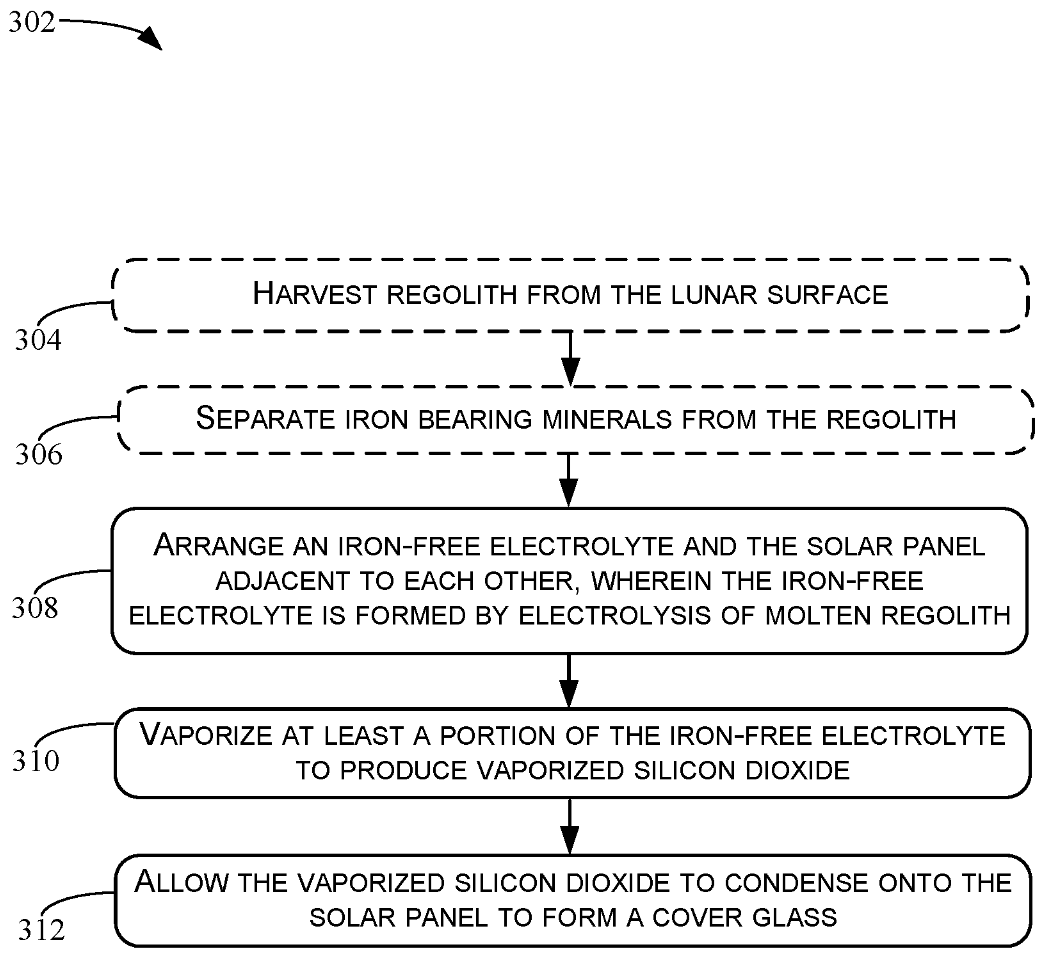
FIG. 3 is a flow diagram of a process of growing a lunar-based coverglass material onto a solar panel, according to some embodiments.

FIG. 3 is a flow diagram of a process 302 of growing a lunar-based coverglass material onto a solar panel, according to some embodiments. Process 302, which may be performed by an operator that is human, a computer processor, or a combination of both, may involve steps leading from lunar regolith to an iron-depleted electrolyte produced from an MRE process, for example. For example, in one implementation, iron-depleted electrolyte may be attained by taking the slag from an iron-producing molten regolith electrolysis process, wherein the iron is mostly removed. Also, separately heating and condensing a mixture of metal oxides may be another method for reducing iron oxide content. Clever choice of regolith harvesting location may also be a possibility, such as choosing a location on the Moon that has an appropriate mixture of metal oxides to make transparent coverglass.

At 304, the operator may harvest regolith from the lunar surface. Such harvesting may be a mining process of scooping up relatively large quantities of regolith and collecting the material into bins for the following separation treatments. In other implementations, regolith may be harvested from sources other than the Moon. Accordingly, claimed subject matter is not limited to lunar regolith. At 306, the operator may separate out iron and/or iron bearing minerals from the bulk regolith. For example, such iron bearing minerals may be pyroxene, olivine, or ilmenite, just to name a few possibilities. Iron may be removed from regolith in a process of MRE, as described above, to produce iron-depleted electrolyte. Other processes for removing iron may be molten oxide electrolysis (MOE), high-gradient magnetic separation, or flotation processes, for example. In some implementations, regolith harvested from the lunar surface may be processed mechanically to separate out at least a substantial portion of iron bearing minerals. At 308, which may, in some embodiments, be an initial step of process 302, the operator may arrange a solar panel or solar cell to be within a line of sight of the iron-depleted electrolyte, as depicted and described for FIG. 2. At 310, the operator may, as also described above, vaporize at least a portion of the iron-depleted electrolyte to produce vaporized transparent silicate. At 312, the operator may allow the vaporized transparent silicate to condense onto the solar panel to form a coverglass.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific embodiments or examples are presented by way of examples for purposes of illustration and description. They are not intended to be exhaustive of or to limit this disclosure to the precise forms described. Many modifications and variations are possible in view of the above teachings. The embodiments or examples are shown and described in order to best explain the principles of this disclosure and practical applications, to thereby enable others skilled in the art to best utilize this disclosure and various embodiments or examples with various modifications as are suited to the particular use contemplated. It is intended that the scope of this disclosure be defined by the following claims and their equivalents.

We claim as follows:

1. A method for forming a silicate coating on a substrate, the method comprising:

positioning a substrate within a line of sight of an iron-depleted electrolyte formed from molten regolith;

directing a beam of electrons from an electron gun onto the iron-depleted electrolyte to transfer energy to the iron-depleted electrolyte;

vaporizing at least a portion of the iron-depleted electrolyte in response to the transferred energy to produce a vapor comprising silicate species; and allowing the vapor to travel from the iron-depleted electrolyte to the substrate and condense on the substrate to form the silicate coating.

2. The method of claim 1, wherein the positioning and directing are performed in a vacuum environment.

3. The method of claim 2, wherein the vacuum environment comprises a natural vacuum of a lunar surface.

4. The method of claim 1, wherein the iron-depleted electrolyte comprises less than about 0.5% iron by weight.

5. The method of claim 1, wherein the beam of electrons transfers energy to a surface region of the iron-depleted electrolyte to cause localized melting or sublimation of the electrolyte.

6. The method of claim 1, wherein the substrate comprises a solar panel.

7. The method of claim 6, wherein the silicate coating forms a protective layer on the solar panel.

8. The method of claim 1, wherein the iron-depleted electrolyte is contained within a crucible during directing of the beam of electrons.

9. The method of claim 1, wherein the iron-depleted electrolyte is in a molten state during vaporization.

10. The method of claim 1, wherein the beam of electrons is a collimated beam.

11. The method of claim 1, further comprising:

harvesting regolith; and removing iron-bearing material from the regolith to form the iron-depleted electrolyte.

12. A method for forming a silicate coating on a substrate, the method comprising:

positioning a substrate within a line of sight of an iron-depleted electrolyte formed from molten regolith;

heating the iron-depleted electrolyte to vaporize at least a portion of the iron-depleted electrolyte to produce a vapor comprising silicate species; and allowing the vapor to travel from the iron-depleted electrolyte to the substrate and condense on the substrate to form the silicate coating.

13. The method of claim 12, wherein heating comprises applying heat from a molten regolith electrolysis process.

14. The method of claim 12, wherein the heating and condensing are performed in a vacuum environment.

* * * * *